(12) United States Patent
Ono

(10) Patent No.: US 10,110,797 B2
(45) Date of Patent: Oct. 23, 2018

(54) IMAGING DEVICE AND IMAGING SYSTEM

(71) Applicant: CANON KABUSHIKI KAISHA, Tokyo (JP)

(72) Inventor: Toshiaki Ono, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/203,508

(22) Filed: Jul. 6, 2016

(65) Prior Publication Data
US 2017/0034422 A1 Feb. 2, 2017

(30) Foreign Application Priority Data

Jul. 27, 2015 (JP) ................... 2015-147685

(51) Int. Cl.
*H04N 5/232* (2006.01)
*H04N 5/369* (2011.01)
*H04N 9/04* (2006.01)
*H01L 27/146* (2006.01)
*H04N 5/374* (2011.01)
*H04N 5/378* (2011.01)

(52) U.S. Cl.
CPC ... *H04N 5/23212* (2013.01); *H01L 27/14641* (2013.01); *H04N 5/3696* (2013.01); *H04N 5/378* (2013.01); *H04N 5/3742* (2013.01); *H04N 9/045* (2013.01)

(58) Field of Classification Search
CPC ............ H04N 5/23212; H04N 5/3696; H04N 5/3742; H04N 9/045; H04N 5/378; H01L 27/14641
See application file for complete search history.

(56) References Cited

U.S. PATENT DOCUMENTS

| 7,787,037 B2 | 8/2010 | Ono |
| 7,817,199 B2 | 10/2010 | Yamashita |
| 7,986,353 B2 | 7/2011 | Ono |

(Continued)

FOREIGN PATENT DOCUMENTS

| JP | 2013-211833 | 10/2013 |
| JP | 2014-106478 | 6/2014 |
| JP | 2015-129846 | 7/2015 |

OTHER PUBLICATIONS

U.S. Appl. No. 15/064,805, filed Mar. 9, 2016.
U.S. Appl. No. 15/070,351, filed Mar. 15, 2016.
U.S. Appl. No. 12/033,924, filed Feb. 20, 2008 (abandoned).

*Primary Examiner* — Albert Cutler
(74) *Attorney, Agent, or Firm* — Fitzpatrick, Cella, Harper & Scinto

(57) ABSTRACT

Provided is an imaging device that includes a pixel unit in which each of a plurality of pixels includes m photoelectric conversion units and each of at least a part of the plurality of pixels outputs a first signal based on signal charges of n photoelectric conversion unit or units, where n is less than m; an adder unit configured to add a plurality of first signals output from a plurality of pixels different from each other; a determination unit configured to compare each of the plurality of first signals and a predetermined threshold to determine whether or not the plurality of first signals added by the adder unit include a signal larger than a predetermined threshold; and an output unit configured to output a determination result and the added signal.

5 Claims, 14 Drawing Sheets

(56) References Cited

U.S. PATENT DOCUMENTS

| | | |
|---|---|---|
| 8,085,319 B2 | 12/2011 | Ono |
| 8,670,049 B2 | 3/2014 | Ono |
| 8,675,107 B2 | 3/2014 | Yamashita |
| 8,810,705 B2 | 8/2014 | Ono |
| 8,860,858 B2 | 10/2014 | Ono |
| 9,025,041 B2 | 5/2015 | Ono |
| 9,093,340 B2 | 7/2015 | Ono |
| 9,137,471 B2 | 9/2015 | Ono |
| 9,153,610 B2 | 10/2015 | Kobayashi |
| 9,225,923 B2 | 12/2015 | Hashimoto |
| 9,363,429 B2 | 6/2016 | Saito |
| 2013/0286275 A1* | 10/2013 | Ogawa ............... H04N 5/23212 348/345 |
| 2014/0146196 A1 | 5/2014 | Shoda |
| 2015/0009385 A1 | 1/2015 | Tsukida |
| 2015/0077605 A1 | 3/2015 | Takada |
| 2015/0138415 A1 | 5/2015 | Ono |
| 2015/0341579 A1 | 11/2015 | Kobayashi |
| 2016/0205332 A1* | 7/2016 | Lee ....................... H04N 5/378 348/241 |

* cited by examiner

IMAGING DEVICE AND IMAGING SYSTEM

BACKGROUND OF THE INVENTION

Field of the Invention

The present invention relates to an imaging device and an imaging system.

Description of the Related Art

Japanese Patent Application Laid-open No. 2013-211833 discloses a technique of increasing the speed in an imaging device having a plurality of pixels each of which includes a plurality of photoelectric conversion units. Each of the plurality of pixels included in the imaging device outputs a ranging signal that is based on signal charges of a part of the plurality of photoelectric conversion units and an image signal that is based on signal charges of the plurality of photoelectric conversion units. Further, Japanese Patent Application Laid-open No. 2013-211833 also discloses an imaging device that adds ranging signals of a plurality of pixels and outputs the added ranging signals.

Further, Japanese Patent Application Laid-open No. 2014-106478 discloses detecting saturation of a signal that is based on charges of a part of the plurality of photoelectric conversion units included in a pixel and detecting saturation of a signal that is based on charges of other photoelectric conversion units.

In an imaging device that adds ranging signals of a plurality of pixels and outputs the added ranging signals, however, an error may occur in ranging information when there is saturation in at least one of the plurality of ranging signals to be added. This may cause an error in a process in an imaging system on which the imaging device is mounted.

SUMMARY OF THE INVENTION

An imaging device according to an aspect of the present invention includes a pixel unit including a plurality of pixels arranged in a matrix, in which each of the plurality of pixels includes m photoelectric conversion units configured to generate signal charges, where m is an integer greater than or equal to two, and outputs a signal based on the signal charges, and in which each of at least a part of the plurality of pixels outputs a first signal that is based on the signal charges of n photoelectric conversion unit or units out of the m photoelectric conversion units, where n is an integer less than m; an adder unit configured to add a plurality of the first signals output from the plurality of pixels which are different from each other; a determination unit configured to determine whether or not the plurality of the first signals added by the adder unit include a signal greater than a predetermined threshold; and an output unit configured to output a determination result determined by the determination unit and a signal obtained by the adder unit adding the plurality of the first signals.

An imaging system according to another aspect of the present invention includes an imaging device including a pixel unit including a plurality of pixels arranged in a matrix, in which each of the plurality of pixels includes m photoelectric conversion units configured to generate signal charges, where m is an integer greater than or equal to two, and outputs a signal based on the signal charges, and in which each of at least a part of the plurality of pixels outputs a first signal that is based on the signal charges of n photoelectric conversion unit or units out of the m photoelectric conversion units, where n is an integer less than m; an adder unit configured to add a plurality of the first signals output from the plurality of pixels that are different from each other; a determination unit configured to determine whether or not the plurality of the first signals added by the adder unit include a signal greater than a predetermined threshold; and an output unit configured to output a determination result determined by the determination unit and a signal obtained by the adder unit adding the plurality of the first signals. The imaging system further includes a signal processing unit that is input, from the imaging device, with determination results determined by the determination unit and ranging signals obtained by the adder unit adding a plurality of the first signals and uses the ranging signals to perform focus detection, in which the signal processing unit performs the focus detection without using a ranging signal, out of the ranging signals, that corresponds to the determination result indicating that the plurality of the first signals include a signal larger than a predetermined threshold.

An imaging system according to another aspect of the present invention includes an imaging device including a pixel unit including a plurality of pixels arranged in a matrix, in which each of the plurality of pixels includes m photoelectric conversion units configured to generate signal charges, where m is an integer greater than or equal to two, and outputs a signal based on the signal charges, and in which each of at least a part of the plurality of pixels outputs a first signal that is based on the signal charges of n photoelectric conversion unit or units out of the m photoelectric conversion units, where n is an integer less than m. The imaging system further includes a signal processing unit configured to process a signal output by the imaging device, the signal processing unit including, a adder unit configured to add a plurality of the first signals output from the plurality of pixels different from each other, a determination unit configured to determine whether or not a plurality of the first signal added by the adder unit includes a signal larger than a predetermined threshold, and an output unit configured to output a determination result determined by the determination unit and a signal obtained by the adder unit adding the plurality of the first signals.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
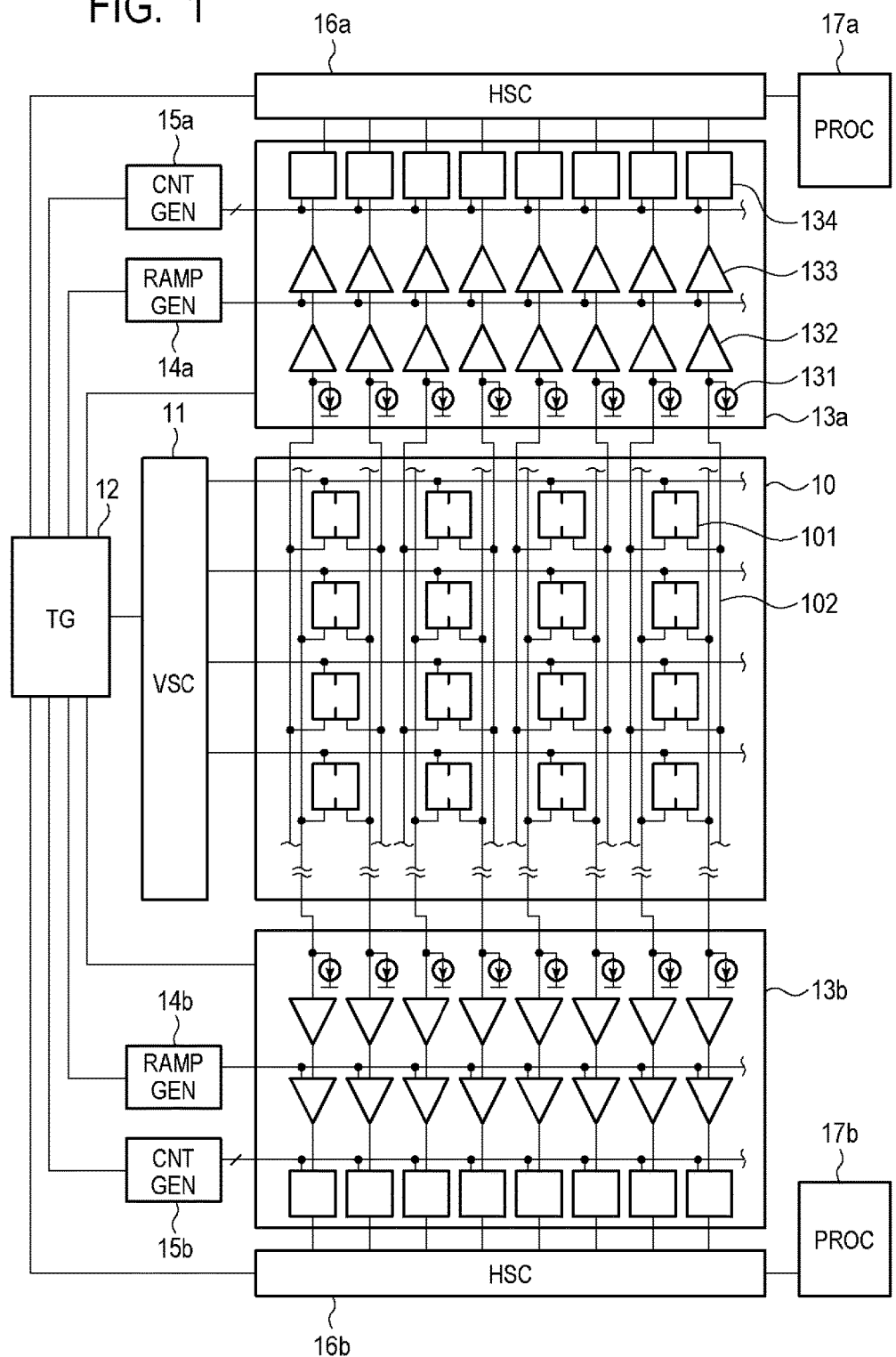
FIG. 1 is a diagram illustrating a configuration of an imaging device according to a first embodiment.

FIG. 1 is a diagram illustrating a configuration of an imaging device according to the first embodiment. The imaging device has a pixel unit 10, a vertical scanning circuit (VSC) 11, and a timing generator (TG) 12. The imaging device further has readout circuits 13a and 13b, ramp signal generators (RAMP GEN) 14a and 14b, count signal generators (CNT GEN) 15a and 15b, horizontal scanning circuits (HSC) 16a and 16b, and signal processing units (PROC) 17a and 17b.

The pixel unit 10 includes a plurality of pixels 101 arranged in a matrix. The vertical scanning circuit 11 outputs control signals for controlling the pixels 101 on a row basis. The pixel 101 in a row selected by control from the vertical scanning circuit 11 outputs a signal to the readout circuit 13a or the readout circuit 13b via the vertical output lines 102 provided for each column.

The pixel 101 on a first row is connected to the readout circuit 13a via the associated vertical output line 102, and the pixel 101 on a second row is connected to the readout circuit 13b via the associated vertical output line 102. In the same manner, the pixels 101 on odd-numbered rows are connected to the readout circuit 13a via the associated vertical output lines 102, and the pixels 101 on even-numbered rows are connected to the readout circuit 13b via the associated vertical output lines 102.

Each of the readout circuits 13a and 13b includes constant current sources 131, amplifier circuits 132, comparators 133, and memories 134, each of which is provided correspondingly to each column of the pixels 101.

While the configuration of the readout circuit 13a will be described below, since the configuration of the readout circuit 13b has the same configuration as the readout circuit 13a, description thereof will be omitted.

Each constant current source 131 supplies to each vertical output line 102 a current for reading a signal from each pixel 101. A signal from each pixel 101 flowing on each vertical output line 102 is input to each amplifier circuit 132. A signal output from each amplifier circuit 132 is input to one of the input terminals of each comparator 133. The ramp signal generator 14a outputs a ramp signal to the other input terminals of the comparators 133. The ramp signal is a signal whose potential varies linearly with time to be a reference signal used in comparison of potentials at the comparators 133.

Each comparator 133 compares an output potential of each amplifier circuit 132 with a potential of a ramp signal from the ramp signal generator 14a, and the output of the comparator 133 is inverted when the magnitude relationship of these potentials is inverted. The count signal generator 15a generates a count signal that is counted up in proportion to time. Each memory 134 obtains a count signal at the time of an inversion of the output of each comparator 133 and holds the count signal as a digital signal. Thereby, a value proportional to the time until the output of each comparator 133 is inverted, that is, a value proportional to a voltage of an output signal from each pixel 101 is held in each memory 134. Thereby, output signals from the pixels 101 are converted into digital signals. That is, each comparator 133 operates as an analog-to-digital conversion circuit (AD converter circuit). Any number of bits of an AD-converted digital signal can be defined based on a design specification of an imaging device. For example, this signal can be a 12-bit binary digital signal.

The horizontal scanning circuits 16a and 16b sequentially scan the memories 134 on respective columns and transfer the values held in the memories 134 on respective columns to the signal processing units 17a and 17b, respectively. The signal processing units 17a and 17b process values input from the memories 134 on respective columns to generate output signals.

The timing generator (TG) 12 outputs control signals to the vertical scanning circuit 11, the readout circuits 13a and 13b, the ramp signal generators 14a and 14b, the count signal generators 15a and 15b, and the horizontal scanning circuits 16a and 16b. Based on control by the TG 12, each circuit in the imaging device is sequentially driven.

Figure 2A:
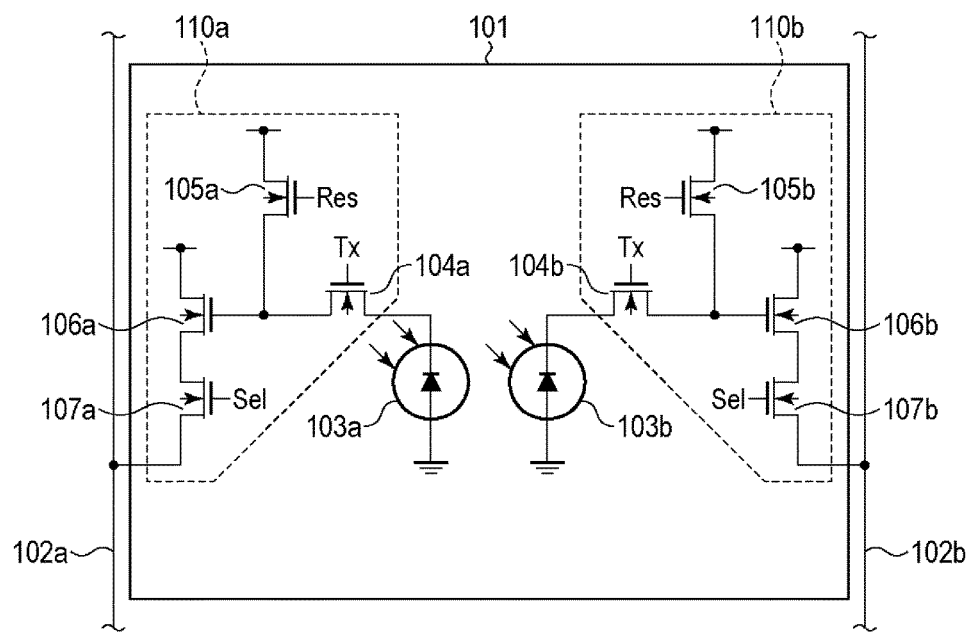
FIG. 2A is an equivalent circuit diagram of a pixel according to the first embodiment.

FIG. 2A is a diagram illustrating an equivalent circuit inside the pixel 101 according to the present embodiment. The pixel 101 includes two photodiodes 103a and 103b, and pixel circuits 110a and 110b are connected to the two photodiodes 103a and 103b, respectively. The photodiodes 103a and 103b are photoelectric conversion units each of which generates charges in accordance with an incident light by a photoelectric conversion and accumulates the charges. The pixel circuit 110a includes a transfer transistor 104a, a reset transistor 105a, an output transistor 106a, and a select transistor 107a. The pixel circuit 110b also includes these transistors in the same manner. The transfer transistors 104a and 104b are controlled to be in a conduction state (an ON-state) or in a non-conduction state (an OFF-state) by a control signal Tx. The reset transistors 105a and 105b are controlled to be in a conduction state or in a non-conduction state by a control signal Res. The select transistors 107a and 107b are controlled to be in a conduction state or in a non-conduction state by a control signal Sel. In the following, while each transistor is illustrated as an N-type MOS transistor, the transistor is not limited thereto. For example, the illustrated circuit may be properly replaced with a circuit using P-type MOS transistors.

A configuration of the pixel circuit 110a will be described. The anode of the photodiode 103a is grounded and the cathode of the photodiode 103a is connected to the source of the transfer transistor 104a. The drain of the transfer transistor 104a and the source of the reset transistor 105a are connected to the gate of the output transistor 106a. The drains of the reset transistor 105a and the output transistor 106a are input with a predetermined voltage such as a power supply voltage. The source of the output transistor 106a is connected to the drain of the select transistor 107a. The source of the select transistor 107a is connected to the vertical output line 102a. Since the pixel circuit 110b has the same configuration as above, description thereof will be omitted.

Figure 2B:
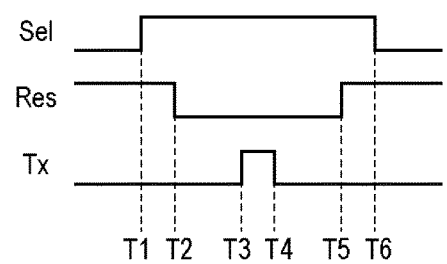
FIG. 2B is a drive timing chart of a pixel circuit according to the first embodiment.

FIG. 2B is a drive timing chart of one pixel row illustrating a driving method of the pixel circuits 110a and 110b. When each of the signals is High, each of the associated transistors is turned on and, when each of the signals is Low, each of the associated transistors is turned off.

In an initial state before time T1, the control signals Sel and Tx are Low and the control signal Res is High. Therefore, the reset transistors 105a and 105b are in an ON-state and thus potentials of the gates of the output transistors 106a and 106b are in a reset state.

At time T1, the control signal Sel becomes High. In response, the select transistors 107a and 107b are turned on and thus the output transistors 106a and 106b of the pixel 101 are connected to the vertical output lines 102a and 102b, respectively.

At time T2, the control signal Res becomes Low. In response, the reset transistors 105a and 105b are turned off, which turns the gates of the output transistors 106a and 106b into a floating state, and thus a voltage corresponding to a reset state appears on the vertical output lines 102a and 102b.

At time 13, the control signal Tx becomes High and the transfer transistors 104a and 104b are turned on. This operation causes signal charges accumulated in the photodiodes 103a and 103b to be transferred to the gates of the output transistors 106a and 106b, respectively. Thereby, a voltage amplitude in accordance with the amount of signal charges generated by the photodiode 103a appears on the vertical output line 102a, and a voltage amplitude in accordance with the amount of signal charges generated by the photodiode 103b appears on the vertical output line 102b.

Then, the control signal Tx becomes Low at time T4, the control signal Res becomes High at time T5, and the control signal Sel becomes Low at time T6, and thus the original state is resulted and a readout of a signal on the subject row is ended.

Figure 3A:
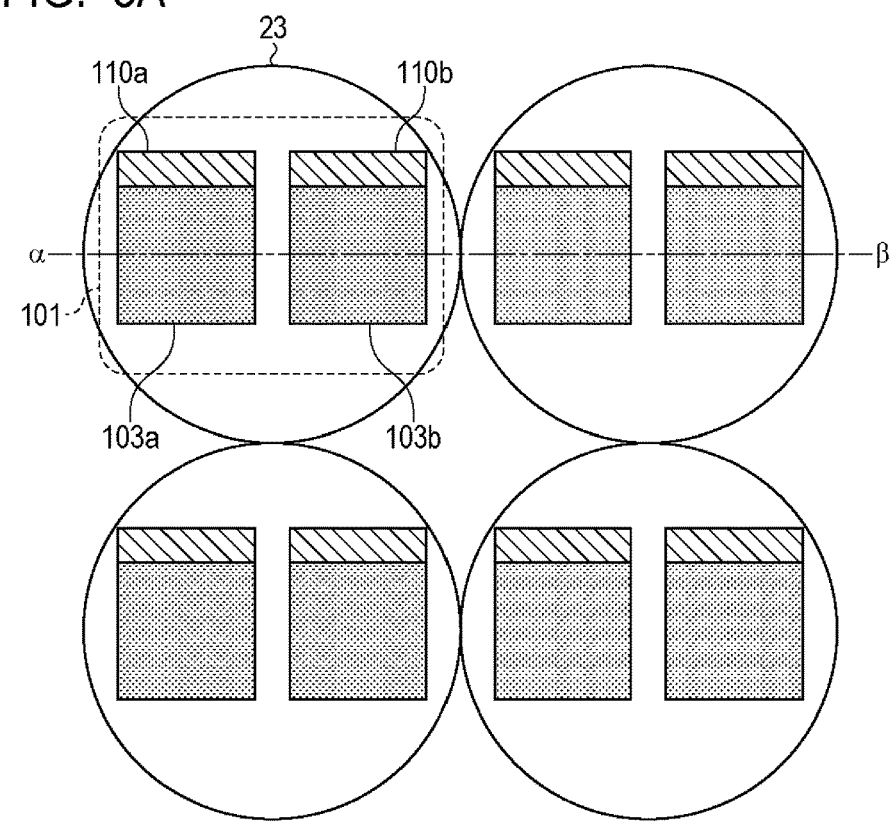
FIG. 3A is a plan view of pixels according to the first embodiment.

FIG. 3A is a plan view of pixels according to the present embodiment. The pixel 101 includes a first photodiode 103a that is a first photoelectric conversion unit, a second photodiode 103b that is a second photoelectric conversion unit, a pixel circuit 110a connected to the photodiode 103a, and a pixel circuit 110b connected to the photodiode 103b. In the following, when the photodiode 103a and the photodiode 103b of one pixel 101 may be collectively referred to as a light receiving unit. A single micro lens 23 is arranged to cover a single light receiving unit and converges a luminous flux into the light receiving unit. That is, a single micro lens 23 is provided correspondingly to a single light receiving unit. Further, a light converged by a single micro lens 23 enters two photodiodes 103a and 103b of each pixel 101 provided correspondingly to the single micro lens 23. The imaging device of the present invention has a micro lens array having a plurality of micro lenses 23.

With such an arrangement of a pixel, a signal from the entire light receiving unit can be represented by adding a signal of the photodiodes 103a and a signal of the photodiodes 103b and thus can be used as an image signal (a second signal) of a subject. Furthermore, in addition to the above, a single signal from the photodiode 103a or the photodiode 103b represents a phase signal of a subject. That is, these signals can be used as two ranging signals (a first signal and a third signal).

Figure 3B:
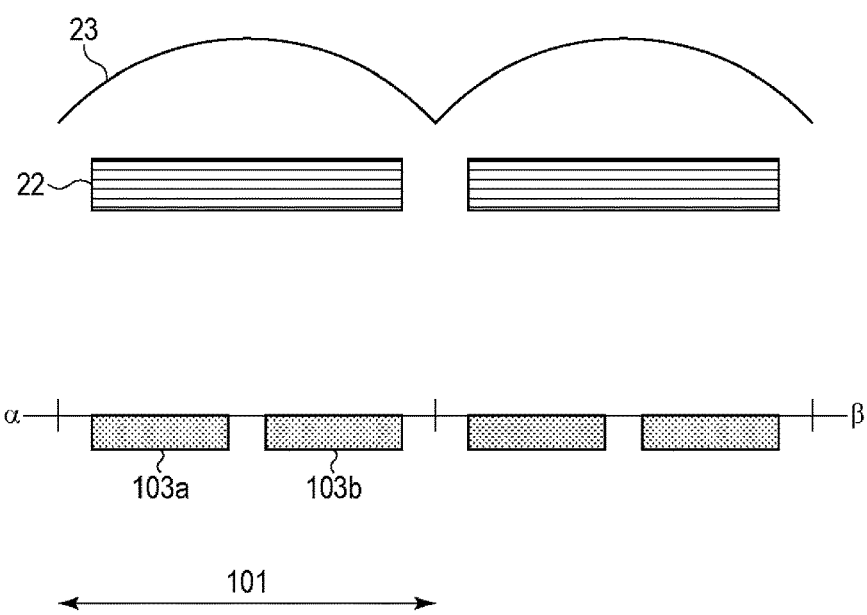
FIG. 3B is a sectional view of the pixels according to the first embodiment.

FIG. 3B is a sectional view of a portion indicated by a line α-β of FIG. 3A. Color filters 22 are provided between the micro lens 23 and the photodiodes 103a and 103b. Each color filter 22 is an optical filter having a wavelength selectivity that selectively transmits an incident light of a predetermined wavelength (a predetermined color).

In the present embodiment, the color filters 22 correspond to three colors of red (R), green (Gr and Gb), and blue (B). Pixels provided with color filters of respective colors are referred to as R pixel, Gr pixel, Gb pixel, and B pixel, respectively. Note that the color filters 22 may have any color combination other than the above, and a complementary color filter may be employed, for example.

Figure 4:
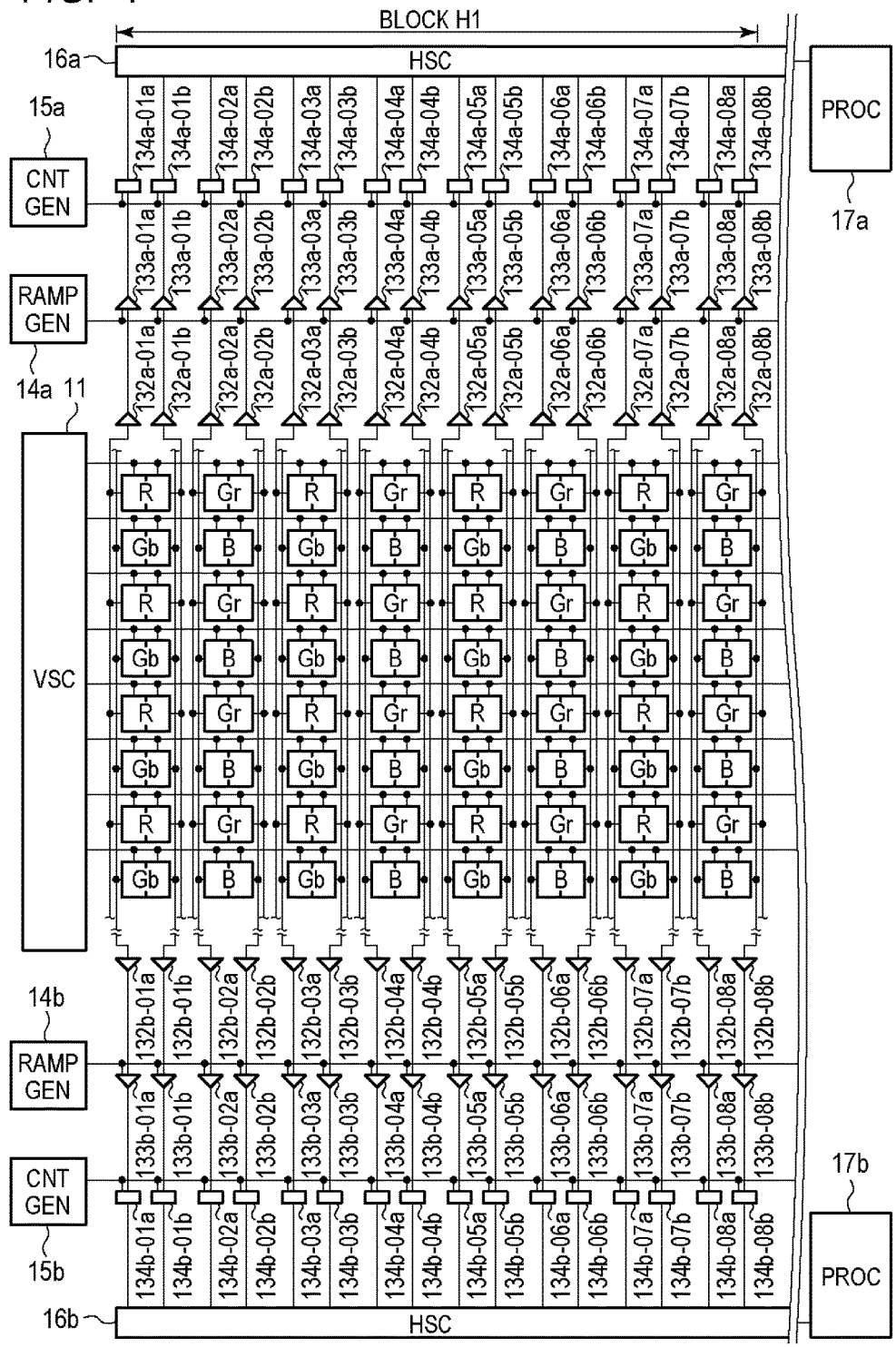
FIG. 4 is a diagram illustrating the configuration of the imaging device according to the first embodiment in greater detail.

Next, a process of output signals in the present embodiment will be described by using FIG. 4. FIG. 4 illustrates in greater detail the configuration of the imaging device described with reference to FIG. 1. A plurality of pixels 101 are arranged in the Bayer arrangement in which an R pixel, a Gr pixel, a Gb pixel, and a B pixel form a unit. Further, reference numerals of respective elements of the amplifier circuits 132, the comparators 133, and the memories 134 are labeled with branch numbers each of which corresponds to a column number and a photodiode connected thereto. For example, an amplifier circuit to which a signal output from the photodiode 103a of the first column is input is denoted as an amplifier circuit 132a-01a. In the following description, a branch number is provided to a reference numeral when an element on a particular column is designated, while no branch number is provided to a reference numeral when it is unnecessary to specify a column. In addition, depiction of the TG 12 is omitted in FIG. 4. The same applies to FIG. 7 and FIG. 12 described later.

When a scanning is started by the vertical scanning circuit 11, the first row and the second row are first selected. At this time, an AD conversion operation described above is performed in the pixels 101 on the first and second rows. Thereby, generated digital signals are held in the memories 134 on respective columns.

Specifically, digital signals from the photodiodes 103a and 103b of an R pixel on the first row and the first column (hereafter, referred to as D data) are held in memories 134a-01a and 134a-01b, respectively. D data from the photodiodes 103a and 103b of a Gr pixel on the first row and the second column are held in memories 134a-02a and 134a-02b. In the same manner, D data from a pixel on the first row and each column are held in the memories 134 on each associated column.

In the same manner, D data from the photodiodes 103a and 103b of a Gb pixel on the second row and the first column are held in memories 134b-01a and 134b-01b. D data from the photodiodes 103a and 103b of a B pixel on the second row and the second column are held in memories 134b-02a and 134b-02b. In the same manner, D data from a pixel on the second row and each column are held in the memories 134 on each associated column.

Transmission of D data from the memories 134 to the signal processing unit 17 will be described. D data held in respective memories 134 are treated by being divided into blocks each including eight columns. That is, the first column to the eight column are grouped as a block H1, the ninth column to the sixteenth column are grouped as a block H2, . . . D data of each block are transmitted in parallel. For example, the block H1 for the first row includes D data output from 16 photodiodes (eight pixels) held in the memory 134a-01a to memory 134a-08b. Since each D data is 12-bit data, 192-bit D data in total are transmitted in parallel. Such parallel transmission allows for high speed transmission.

In the signal processing unit 17a, processes of generating image signals and ranging signals are performed based on input D data. A process of image signals will first be described.

D data of the memory 134a-01a and the memory 134a-01b are first added to obtain added D data in which D data from the photodiodes 103a and 103b of the R pixel on the first row and the first column are added. The added D data is used as an image signal of the R pixel on the first row and the first column.

Next, D data of the memory 134a-02a and the memory 134a-02b are added to obtain added D data in which D data from the photodiodes 103a and 103b of the Gr pixel on the first row and the second column are added. The added D data is used as an image signal of the Gr pixel on the first row and the second column. In the same manner, image signals associated with the pixels on respective columns are obtained.

Figure 5:
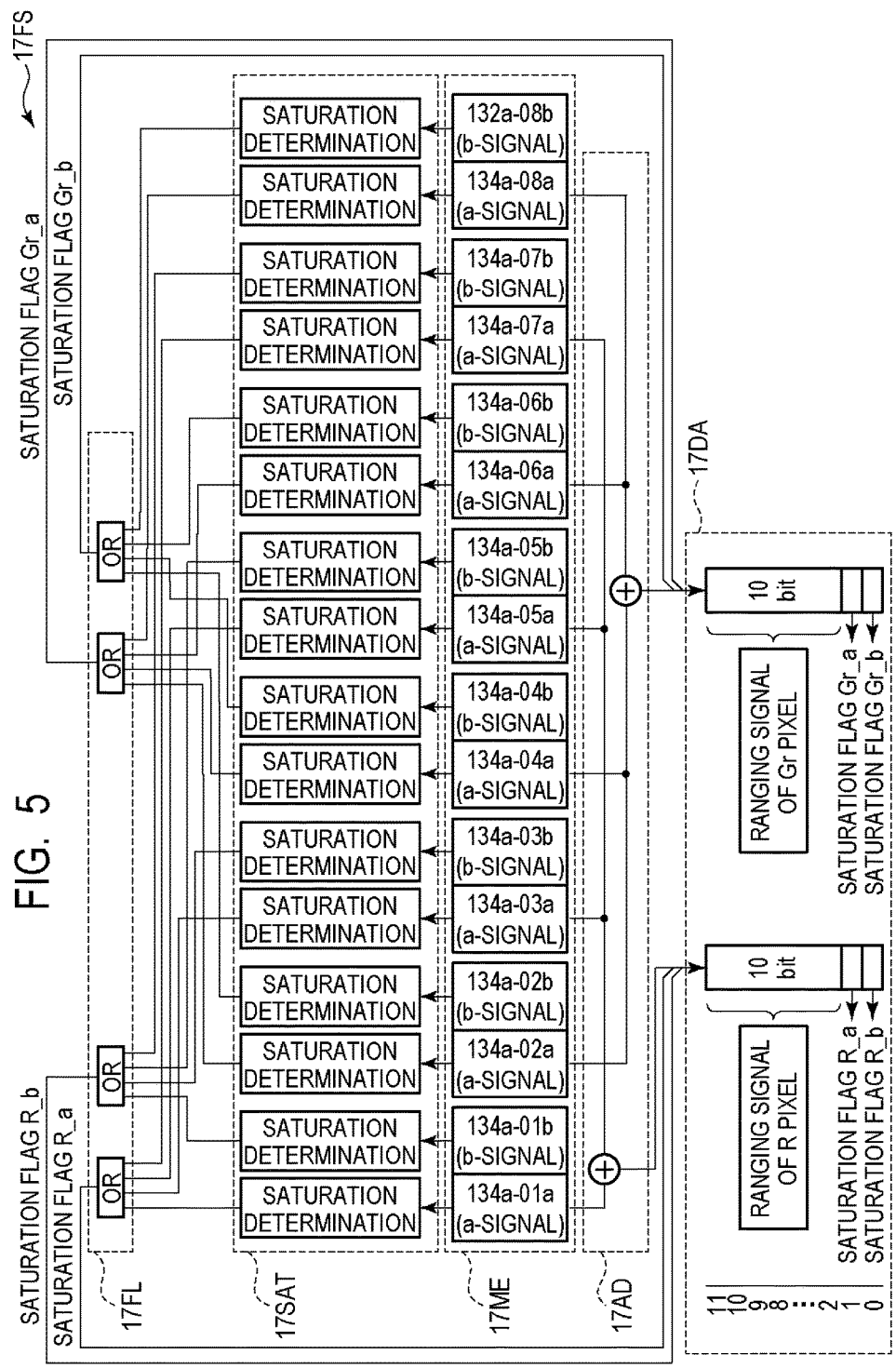
FIG. 5 is a diagram illustrating a configuration of a ranging signal processing unit according to the first embodiment.

In parallel with the above process of image signals, a process of ranging signals is performed. FIG. 5 is a diagram illustrating a configuration of a ranging signal processing unit 17FS that is provided to the signal processing unit 17 to process ranging signals.

The ranging signal processing unit 17FS includes a memory unit 17ME, a saturation determination unit 17SAT, a saturation flag generating unit 17FL, an adder unit 17AD, and a signal output unit 17DA. The memory unit 17ME temporarily holds D data based on the photodiodes 103a (a-signals) and D data based on the photodiodes 103b (b-signals) that are input from the memories 134. The saturation determination unit 17SAT is a determination unit that determines based on D data whether or not there is saturation in signals. The saturation flag generating unit 17FL calculates each logical sum (OR) of saturation determination results of the associated photodiodes 103a and 103b for four D data to be added. The adder unit 17AD adds D data of four photodiodes 103a and 103b to generate added D data. The signal output unit 17DA is an output unit that attaches flag signals to added D data and outputs the added D data with flag signals to the outside of the ranging signal processing unit 17FS. These signals are output signals of the imaging device and are used as ranging information for focus detection or the like in a system processing component such as an imaging system or the like on which the imaging device is mounted.

The ranging signal processing unit 17FS adds D data of the photodiodes 103a and 103b of the same color arranged in the row direction to generate ranging signals. A process of ranging signals for R pixels will first be described.

The saturation determination unit 17SAT determines whether or not each D data from each of the memories 134a-01a, 134a-03a, 134a-05a, and 134a-07a has reached a saturation level. The saturation determination unit 17SAT outputs a High signal to the saturation flag generating unit 17FL when determining that a saturation level has been reached, and outputs a Low signal to the saturation flag generating unit 17FL when determining that a saturation level has not been reached. The determination as to whether or not a signal has reached a saturation level can be made by determining whether or not an input signal is greater than a preset, predetermined saturation threshold.

When it is determined that at least one of the four D data is larger than the saturation threshold based on a signal from the saturation determination unit 17SAT, the saturation flag generating unit 17FL sets a saturation flag R_a to High and outputs it to the signal output unit 17DA. That is, the saturation flag generating unit 17FL outputs a logical sum of signals from the saturation determination unit 17SAT as the saturation flag R_a. Here, the saturation threshold can be set based on the least saturation level of a saturation level of an output of the amplifier circuit 132, a saturation level of an output signal from the pixel 101, and a saturation level of an AD conversion range.

By the same process as above, the saturation determination unit 17SAT determines each D data from the memories 134a-01b, 134a-03b, 134a-05b, and 134a-07b, and the saturation flag generating unit 17FL outputs a saturation flag R_b to the signal output unit 17DA.

In parallel with generation of the saturation flags R_a and R_b described above, the adder unit 17AD adds D data from the memories 134a-01a, 134a-03a, 134a-05a, and 134a-07a and outputs the addition to the signal output unit 17DA. This results in a signal that is an addition of D data of four photodiodes 103a of the R pixel on the first row and the first column, the R pixel on the first row and the third column, the R pixel on the first row and the fifth column, and the R pixel on the first row and the seventh column. The process described above results in a ranging signal based on the photodiodes 103a of the R pixels that is an addition for four pixels on the first row and the first column, on the first row on the third column, the first row on the fifth column, and the first row and the seventh column. As such, by adding signals of pixels on a plurality of columns to generate ranging signals, the number of ranging signals output from the imaging device can be less than the number of image signals, which allows for faster processing.

The signal output unit 17DA outputs the saturation flags R_a and R_b together with a ranging signal of R pixels that is an addition for four pixels. For example, when the ranging signal of R pixels that is an addition for four pixels has 10 bits, an output signal will be a 12-bit signal in which the 10-bit ranging signal is attached with the one-bit saturation flag R_a and one-bit saturation flag R_b, as illustrated in FIG. 5. In this way, ranging signals of R pixels are processed.

A ranging signal of Gr pixels is processed in a similar manner. That is, each D data from the memories 134a-02a, 134a-04a, 134a-06a, and 134a-08a is determined, and the saturation flag generating unit 17FL then outputs a saturation flag GR_a to the signal output unit 17DA. Furthermore, each D data from the memories 134a-02b, 134a-04b, 134a-06b, and 134a-08b is determined, and the saturation flag generating unit 17FL then outputs a saturation flag GR_b to the signal output unit 17DA.

In parallel with generation of the saturation flag R_a described above, the adder unit 17AD adds D data from the memories 134a-02a, 134a-04a, 134a-06a, and 134a-08a and outputs the addition to the signal output unit 17DA. This results in a ranging signal of Gr pixels that is an addition for four pixels on the first row and the second column, on the first row and the fourth column, on the first row and the sixth column, and on the first row and the eighth column. The signal output unit 17DA outputs the saturation flags Gr_a and Gr_b together with a ranging signal of the Gr pixels that is an addition for four pixels.

For example, assuming that a ranging signal of Gr pixels that is an addition for four pixels has 10 bits, an output signal is a 12-bit signal in which the 10-bit ranging signal is attached with the one-bit saturation flag Gr_a and one-bit saturation flag Gr_b, as illustrated in FIG. 5. In this way, ranging signals of Gr pixels are processed.

Similar processes are performed also in the signal processing unit 17b to output an image signal of a Gb pixel on the second row and the first column, an image signal of a B pixel on the second row and the second column, an image signal of a Gb pixel on the second row and the third column, an image signal of a B pixel on the second row and the fourth column, . . . .

In addition to the above, the signal processing unit 17b outputs a signal in which the saturation flag Gb_a and the saturation flag Gb_b are attached to a ranging signal of the Gb pixels that is an addition for four pixels and a signal in which the saturation flag B_a and the saturation flag B_b are attached to a ranging signal of the B pixels that is an addition for four pixels.

As described above, output signals from the imaging device are two types, that is, an image signal from each pixel 101 (a signal generated by adding signals of the photodiodes 103a and 103b) and a ranging signal that is an addition for four pixels (a signal from the photodiode 103a). That is, no signal of the photodiode 103b itself is output. Because, a signal of the photodiode 103b can be calculated as a difference between a signal generated by adding signals of the photodiodes 103a and 103b and a signal of the photodiode 103a, which have already been output.

This calculation can be made as follows, for example. Signals each of which is generated by adding D data of the photodiodes 103a and 103b are added for four pixels. Next, from this added value, D data of the photodiodes 103a added for four pixels is subtracted. With this process, D data of the photodiodes 103b added for four pixels can be calculated.

Therefore, no D data of the photodiodes 103b is output. It is, however, more preferable to perform saturation determination of the photodiodes 103b as described above and output saturation flags of the photodiode 103b. The reason is described below.

Let us assume a case where the signal level output from the photodiode 103a is much smaller than the signal level output from the photodiode 103b. For example, it is assumed that the signal level of the photodiode 103a is 80, the signal level of the photodiode 103b is 350, and a circuit saturation level of an AD conversion is 256.

In this case, a value AD-converted from the signal from the photodiode 103a will be 80 and a value AD-converted from the signal from the photodiode 103b will be 256, and a sum of these values will be 336.

The following case is here considered where signals associated with the photodiodes 103a of respective pixels and added signals for the photodiodes 103a and 103b of respective pixels are separately output without addition among pixels, that is, where neither ranging signal nor image signal is added among pixels. In this case, with calculation of differences thereof in the latter stage, it can be calculated that the signal level associated with the photodiodes 103b is 256 and, based on this value, it can be determined whether or not there is circuit saturation.

In the present embodiment, however, since signals of the photodiodes 103a are added for four pixels, the signal level of the photodiode 103a of each pixel cannot be separately calculated in the latter stage. Therefore, even with the difference described above, there may be a case where it cannot be determined whether or not there is circuit saturation occurring in the photodiode 103b of each pixel.

Furthermore, even by referring to any of an added signal of the photodiodes 103a and 103b, an output signal of the photodiodes 103a added for four pixels, and its associated saturation flags, there may be a case where it cannot be determined whether or not a signal of the photodiode 103b is saturated. Therefore, in order to determine signal saturation of the photodiode 103b, it is preferable to output a saturation flag that indicates whether or not a saturation level of the photodiode 103b has been reached.

As discussed above, in the present embodiment, when adding and outputting ranging signals, the saturation flags are included in an output signal. Thereby, whether or not a signal whose saturation level has been reached is included in the added output signal can be transferred to an external system processing component.

This allows for less likelihood of false recognition that would otherwise be caused by the system processing component obtaining erroneous ranging information due to added D data of an incorrect value resulted from saturation. The system processing component is configured such that a ranging signal whose saturation flag indicates signal saturation is not used in a ranging operation for focus detection. In this case, the system processing component may use a signal obtained by interpolating signals of neighboring pixels instead of the ranging signal whose saturation flag indicates signal saturation. Alternatively, the system processing component may ignore the ranging signal whose saturation flag indicates signal saturation in a process.

Note that, in the above description, since the saturation flags R_a, R_b, Gr_a, and Gr_b are output separately, these flags make up data with four bits in total. However, a logical sum of some or all of the saturation flags R_a, R_b, Gr_a, and Gr_b may be calculated to compress them into three bits or less and, for example, may be output as compressed one-bit data. Compressing saturation flags to reduce the number of bits can reduce transmission load of D data.

Further, although the example in which the signal output unit 17DA outputs an added ranging signal attached with saturation flags has been illustrated in the above description, an image signal attached with one or more saturation flags may be output.

Furthermore, although the arrangement having two photoelectric conversion units in a single pixel 101 has been exemplified in the above description, a single pixel 101 may have more than two photoelectric conversion units. A specific example is provided below.

It is assumed that the number of photoelectric conversion units in a plurality of pixels 101 included in the pixel unit 10 is m (m is an integer of two or greater). In this case, a ranging signal (the first signal) can be generated based on signal charges of n photoelectric conversion unit(s) (n is an integer), where n is less than m. In this case, another ranging signal (the third signal) used together with the ranging signal described above is based on signal charges of (m−n) photoelectric conversion unit(s) resulted by excluding the n photoelectric conversion unit(s) described above from the m photoelectric conversion units described above. While the arrangement having two photoelectric conversion units formed of the photodiodes 103a and 103b of the present embodiment is an example where m is two and n is one, m and n may be other values, allowing for the same advantages.

Further, although the configuration in which D data from eight pixels are transmitted in parallel from the memories 134 has been exemplified in the above description, the number of pixels to be grouped may be smaller or greater than eight. Furthermore, the configuration in which a ranging signal is generated by adding D data for four pixels has been exemplified, the number of pixels for the addition may also be smaller or greater than four.

Further, an addition process of signals of the photodiodes 103a of a plurality of pixels 101 and a determination process as to whether or not the signal level of the photodiode 103a has reached a saturation level may be performed by a system processing component provided outside the imaging device. That is, some or all of the functions of the signal processing units 17a and 17b may be provided to the system processing component instead of the imaging device.

Note that it is not necessary to output ranging signals from all the pixels 101 of the pixel unit 10 and it will be sufficient to provide ranging signals necessary for ranging. That is, the number of ranging signals may be smaller than the number of image signals (the second signals). For example, ranging signals may be output from only a part of the area of the pixel unit 10 and image signals may be output from the entire area of the pixel unit 10. This allows for faster signal processing.

Second Embodiment

A process of output signals in an imaging device according to the second embodiment will be described by using FIG. 4 and FIG. 6. Since the configuration of the imaging device according to the second embodiment is the same as that of the first embodiment except the ranging signal processing unit 17FS, duplicated description will be omitted or simplified.

In the second embodiment, unlike the first embodiment, the ranging signal processing unit 17FS performs addition of D data of neighboring pixels, that is, D data of photodiodes which have color filters of different colors.

The saturation determination unit 17SAT determines whether or not D data associated with each R pixel from each of the memories 134a-01a, 134a-01b, 134a-03a, and 134a-03b pixel has reached a saturation level. The saturation determination unit 17SAT outputs a High signal to the saturation flag generating unit 17FL when determining that a saturation level has been reached, and outputs a Low signal to the saturation flag generating unit 17FL when determining that a saturation level has not been reached. When it is determined that at least one of the four D data is larger than a saturation threshold based on signals from the saturation determination unit 17SAT, the saturation flag generating unit 17FL sets a saturation flag R to High and outputs it to the signal output unit 17DA.

The saturation determination unit 17SAT determines whether or not D data of each Gr pixel from each of the memories 134a-02a, 134a-02b, 134a-04a, and 134a-04b has reached a saturation level. The saturation determination unit 17SAT outputs a High signal to the saturation flag generating unit 17FL when determining that a saturation level has been reached, and outputs a Low signal to the saturation flag generating unit 17FL when determining that a saturation level has not been reached. When it is determined that at least one of the four D data is larger than a saturation threshold based on signals from the saturation determination unit 17SAT, the saturation flag generating unit 17FL sets a saturation flag Gr to High and outputs it to the signal output unit 17DA.

The adder unit 17AD adds D data of the memories 134a-01a, 134a-02a, 134a-03a, and 134a-04a and outputs the addition to the signal output unit 17DA. This results in an output that adds signals of four photodiodes 103a on the first row and the first column to the first row and the fourth column. This signal is used as a ranging signal.

The signal output unit 17DA outputs the saturation flag R and the saturation flag Gr together with a ranging signal that is an addition for four pixels.

Figure 6:
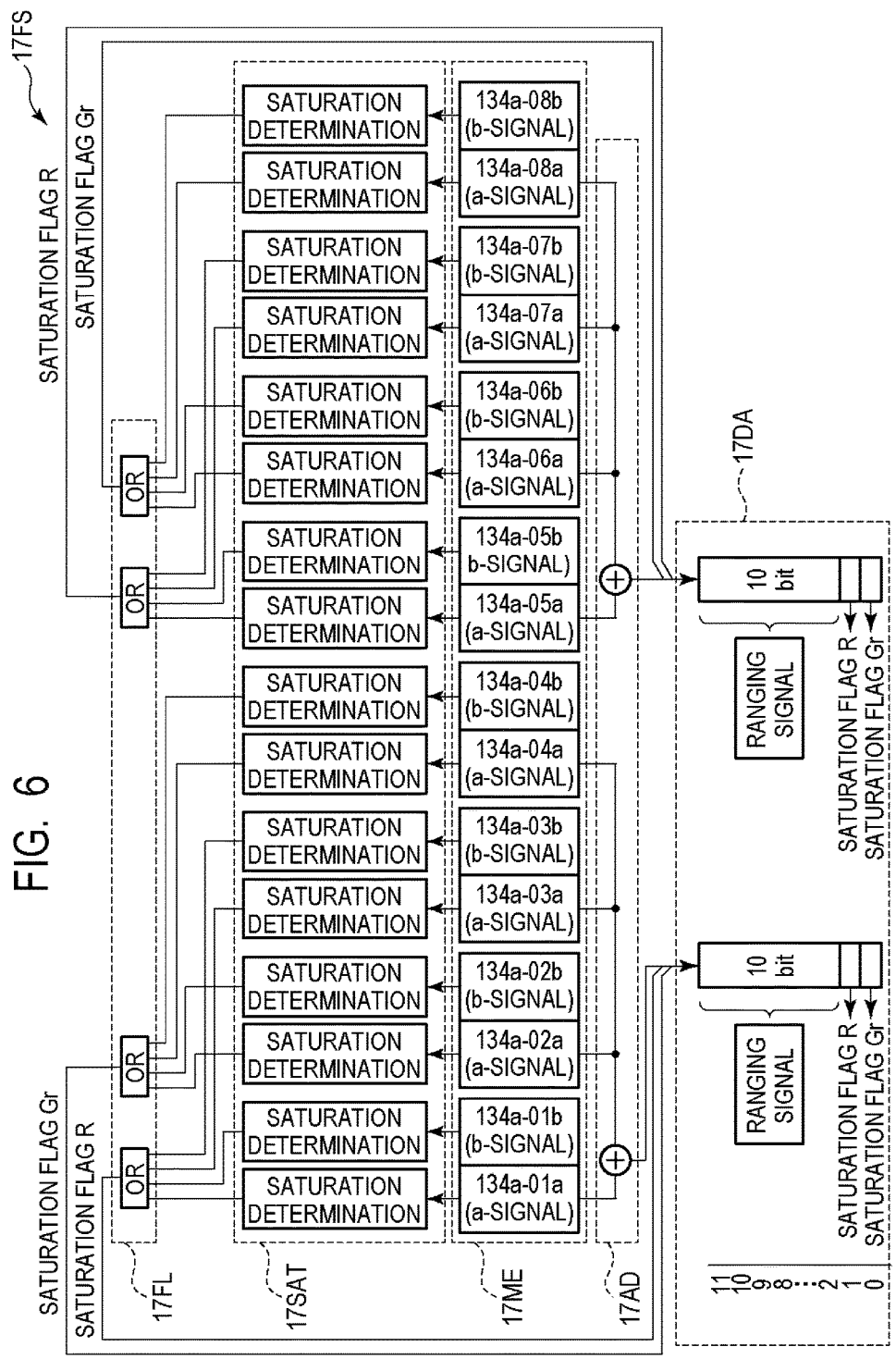
FIG. 6 is a diagram illustrating a signal output process according to a second embodiment.

For example, assuming that the ranging signal that is an addition for four pixels has 10 bits, an output signal will be a 12-bit signal in which the 10-bit ranging signal is attached with the one-bit saturation flag R and one-bit saturation flag Gr, as illustrated in FIG. 6. In this way, ranging signals are processed.

For example, assuming that the ranging signal of R pixels that is an addition for four pixels has 10 bits, an output signal will be a 12-bit signal in which the 10-bit ranging signal is attached with the one-bit saturation flag R and one-bit saturation flag Gr, as illustrated in FIG. 6. In this way, ranging signals of R pixels are processed.

The same process is performed in the signal processing unit 17b, and a signal is output in which saturation flags Gb and B are attached to ranging signal that is an addition for four pixels on the second row and the first column to the second row and the fourth column.

As discussed above, the second embodiment can output a signal in which saturation flags are attached to a ranging signal similarly to the first embodiment and allows for the same advantages as those of the first embodiment. In addition, because of a high resolution of a spatial sampling phase of a ranging signal, ranging accuracy can be improved. Note that, although the saturation flag R and the saturation flag Gr are output separately, respectively in the above description, a logical sum of the saturation flag R and the saturation flag Gr may be calculated to output compressed one-bit data. Reducing the number of bits by compressing saturation flags can reduce transmission load of D data.

Third Embodiment

With reference to FIG. 7, FIG. 8, FIG. 9A, and FIG. 9B, the third embodiment will be described. The present embodiment relates to an imaging device having a circuit arrangement in which signals output from pixels are output as analog signals without converted into digital signals.

Figure 7:
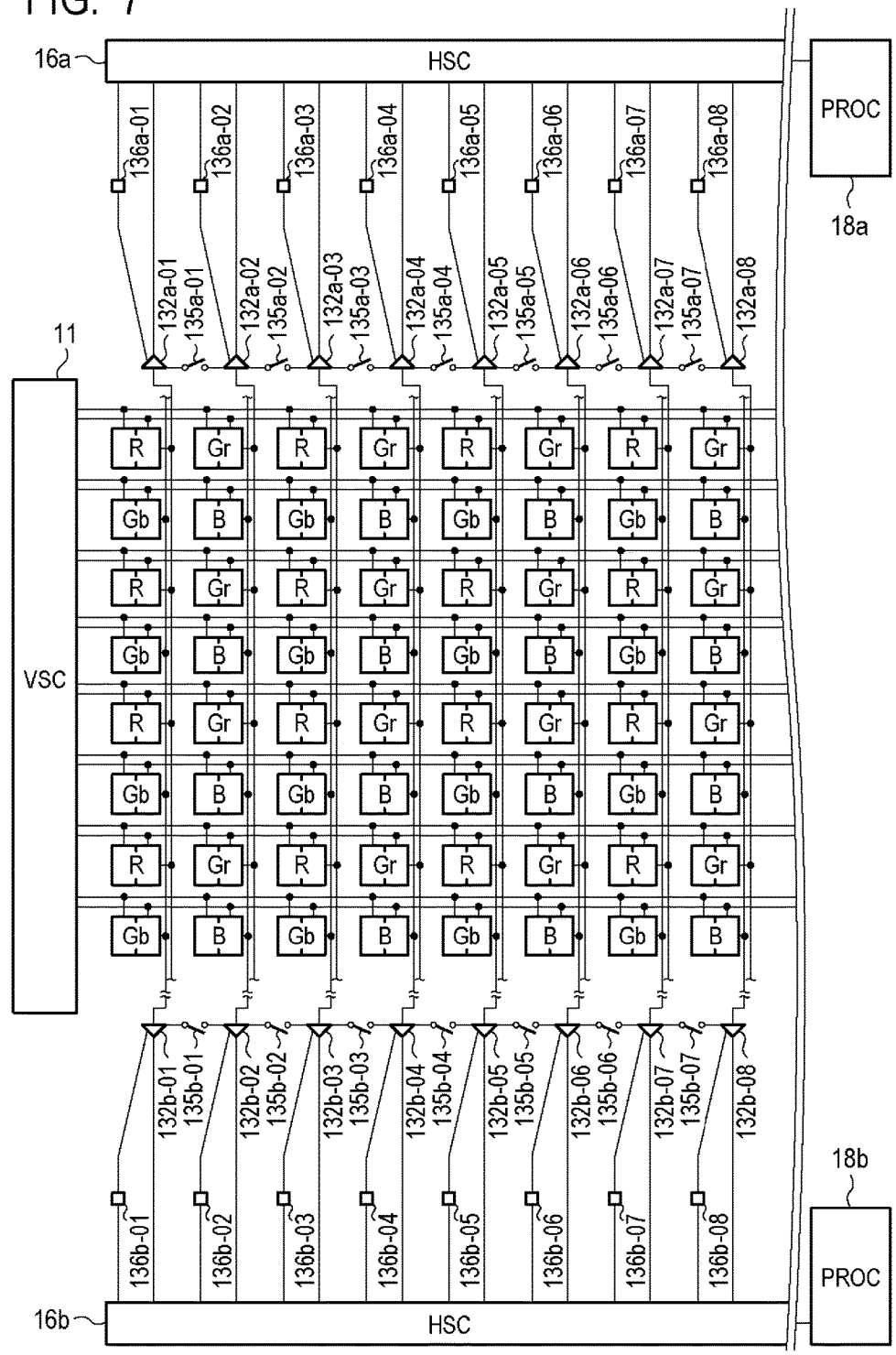
FIG. 7 is a diagram illustrating a configuration of an imaging device according to a third embodiment.

FIG. 7 is a diagram illustrating of the imaging device of the third embodiment. The imaging device of the present embodiment has no circuit that performs an AD conversion on a column basis as seen in the first and second embodiments, and thus neither comparators 133 nor memories 134 is provided. On the other hand, in the imaging device of the present embodiment, adder switches 135 (an adder unit) and saturation determination units 136 are provided on a column basis. A configuration of the imaging device of the present embodiment will be described below mainly for sections different from the first and second embodiments.

Each of the adder switches 135 is provided between the amplifier circuits 132 on neighboring columns. That is, for example, an adder switch 135a-01 is provided between the amplifier circuit 132a-01 on the first column and the amplifier circuit 132a-02 on the second column. When one adder switch 135 is turned on, signals on the neighboring columns interposing the one adder switch 135 are added.

Saturation determination units 136 are connected to the amplifier circuits 132. Each saturation determination unit 136 determines saturation of a signal amplified by each amplifier circuit 132 and outputs a saturation flag indicating a determination result. The horizontal scanning circuit 16a sequentially outputs, to an output amplifier 18a, each output signal from the amplifier circuit 132 and a saturation flag from the saturation determination unit 136 on each column. The horizontal scanning circuit 16b sequentially outputs, to an output amplifier 18b, each output signal from the amplifier circuit 132 and a saturation flag from the saturation determination unit 136 on each column.

Figure 8:
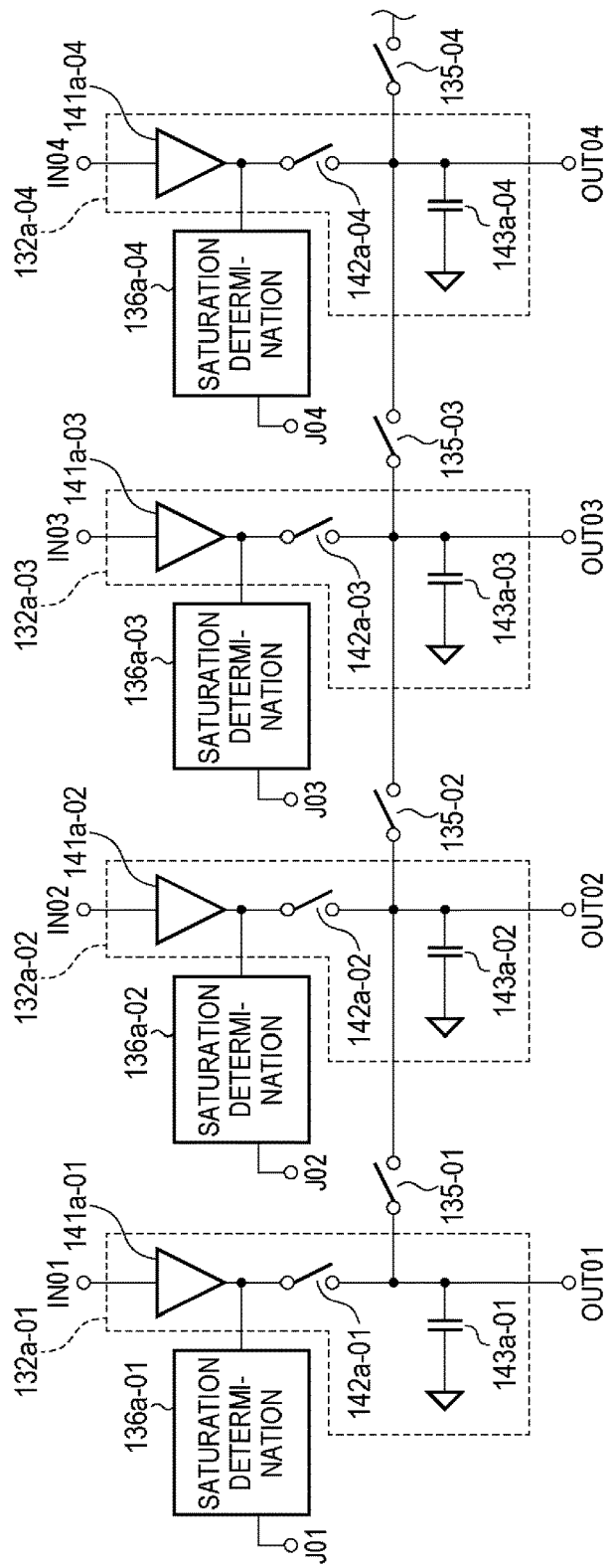
FIG. 8 is a diagram illustrating circuits inside amplifier circuits, adding switches, and saturation determination units according to the third embodiment in greater detail.

FIG. 8 is a diagram illustrating circuits inside the amplifier circuits 132, the adder switches 135, and the saturation determination units 136 in greater detail. In FIG. 8, among the amplifier circuits 132, the adder switches 135, and the saturation determination units 136 on all the columns, those on the first column to the fourth column in the side of the readout circuit 13a are extracted and exemplified.

Each amplifier circuit 132 includes an amplifier 141, a switch 142, and a sample-and-hold capacitor 143. Signals from the pixels 101 are input to input terminals of the amplifier circuits 132. These input terminals are denoted as input terminals IN01, IN02, . . . of the amplifier circuits 132. An output terminal of each amplifier 141 is connected to one terminal of each saturation determination unit 136 and one terminal of each switch 142. The other terminal of each switch 142 is connected to one terminal of each sample-and-hold capacitor 143 and one terminal of each adder switch 135. Respective nodes of these connections are denoted as output terminals OUT01, OUT02, . . . of the amplifier circuits 132. The other terminal of each of the adder switches 135 is connected to each node of the output terminals OUT01, OUT02, . . . on the neighboring column. The other terminal of each sample-and-hold capacitor 143 is grounded. The terminals at each of which a saturation flag is output from each saturation determination unit 136 are denoted as output terminals J01, J02, . . . .

The switch 142 and the sample-and-hold capacitor 143 operate as a sample-and-hold circuit. In response to a control signal amp_sh that controls the switch 142 being High, the switch 142 is turned on and the output voltage of the amplifier 141 is sampled in the sample-and-hold capacitor 143. In response to the control signal amp_sh being Low, the switch 142 is turned off and the output voltage of the amplifier 141 is held in the sample-and-hold capacitor 143.

To output signals separately on a column basis without adding them, all the adder switches (135-01, 135-02, 135-03, 135-04, . . . ) are set to an OFF-state. Thereby, voltages depending on signals input to IN01, IN02, . . . appear at OUT01, OUT02, . . . , respectively.

To add and average signals for four columns before outputting them, the adder switches 135-01, 135-02, and 135-03 are turned on and the adder switch 135-04 is turned off with the control signal amp_sh being Low and the output being held. Thereby, the output voltages at the terminals OUT01, OUT02, OUT03, and OUT04 are added and averaged. In this case, for a signal before added and averaged, the saturation determination unit 136 can determine whether or not an output of the amplifier circuit 132 has reached a saturation level.

The horizontal scanning circuit 16a sequentially scans the sample-and-hold capacitors 143 and the output signals of the saturation determination units 136 on respective columns and transmits a scanned result to the output amplifier 18a.

Figure 9A:
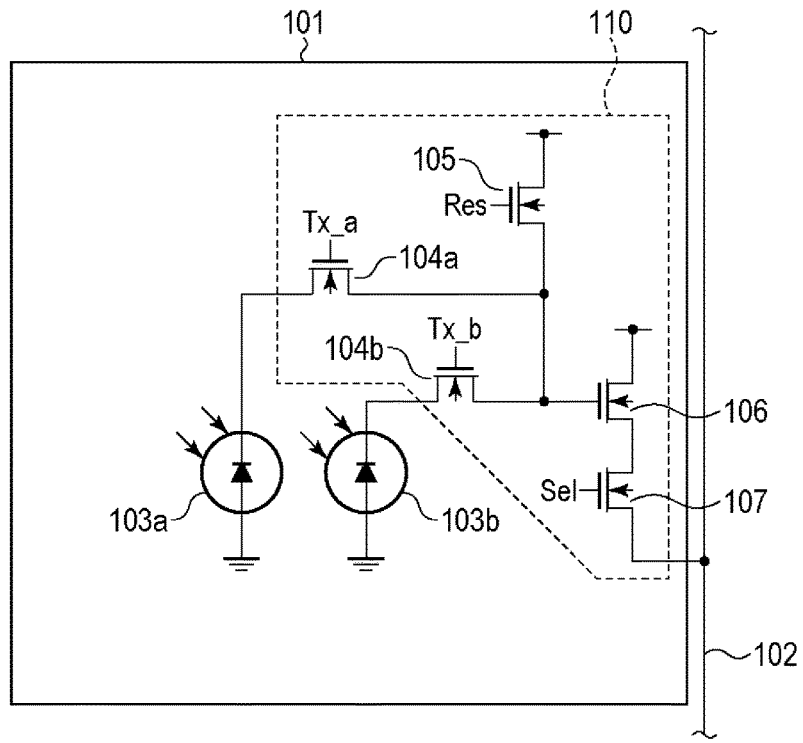
FIG. 9A is an equivalent circuit diagram of a pixel according to the third embodiment.

FIG. 9A is a diagram illustrating an equivalent circuit inside the pixel 101 according to the present embodiment. The pixel 101 of the present embodiment is different from the pixel 101 of the first embodiment in that only one pixel circuit 110 is provided therein. The pixel circuit 110 includes two transfer transistors, transfer transistors 104a and 104b. The photodiodes 103a and 103b are connected to the gate of the same output transistor 106 via the transfer transistors 104a and 104b, respectively. The transfer transistors 104a and 104b are controlled by control signals Tx_a and Tx_b that are separately transmitted from the vertical scanning circuit 11, respectively. Since other features are the same as those in the first embodiment, description thereof will be omitted.

Figure 9B:
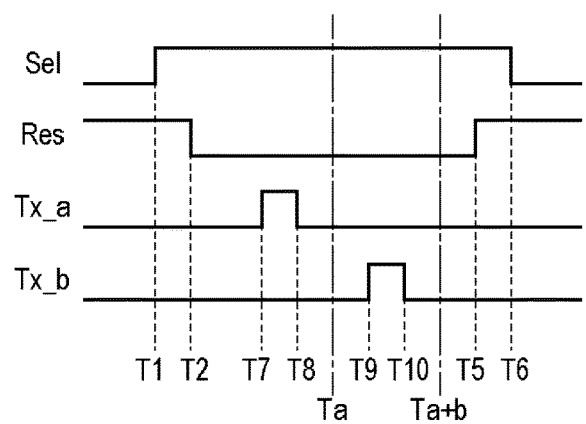
FIG. 9B is a drive timing chart of a pixel circuit according to the third embodiment.

FIG. 9B is a drive timing chart of one pixel row illustrating a driving method of the pixel circuit 110. Operations different from those of the first embodiment illustrated in FIG. 2B will be described.

Operations up to time T2 are substantially the same as those in the first embodiment. At time T7, the control signal Tx_a becomes High and the transfer transistor 104a is turned on. This operation causes signal charges accumulated in the photodiode 103a to be transferred to the gate of the output transistor 106. Then, at time T8, the control signal Tx_a becomes Low and the transfer transistor 104a is turned off. At time Ta when the above operation is completed, a voltage amplitude in accordance with the amount of signal charges generated by the photodiode 103a appears on the vertical output line 102.

Subsequently, at time T9, the control signal Tx_b becomes High and the transfer transistor 104b is turned on. This operation causes signal charges accumulated in the photodiode 103b to be also transferred to the gate of the output transistor 106. Then, at time T10, the control signal Tx_b becomes Low and the transfer transistor 104b is turned off. At time (Ta+b) when the above operation is completed, a voltage amplitude in accordance with a sum of the amount of signal charges generated by the photodiode 103a and the amount of signal charges generated by the photodiode 103b appears on the vertical output line 102. Operations at time T5 and time T6 are then substantially the same as those in the first embodiment.

Figure 10A:
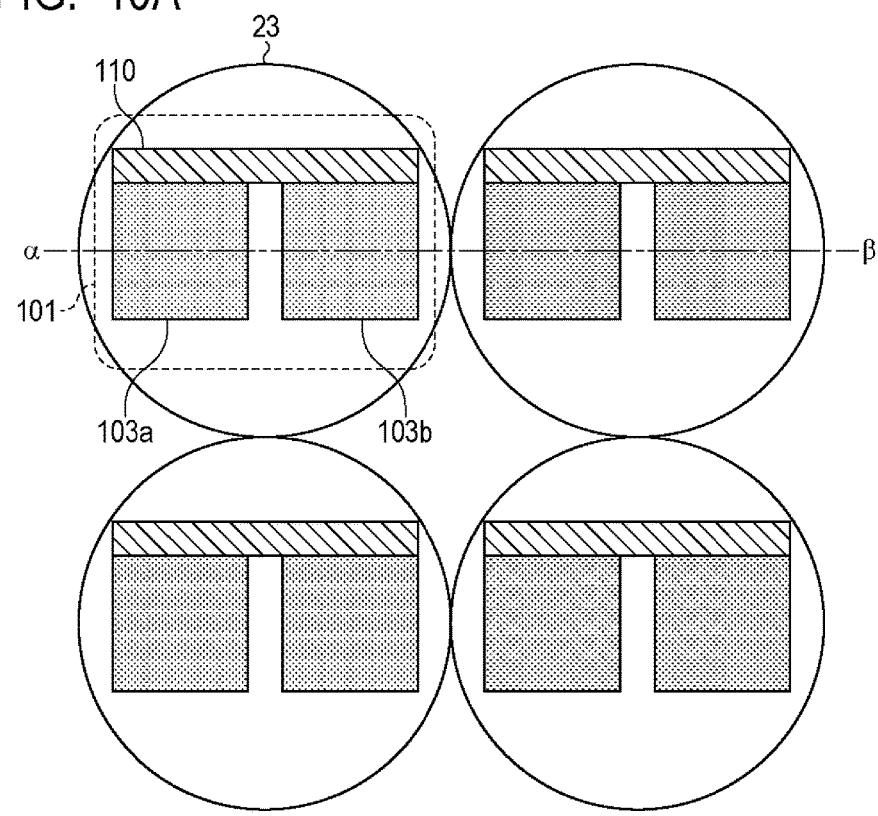
FIG. 10A is a plan view of pixels according to the third embodiment.

FIG. 10A is a schematic plan view of the pixel 101 according to the present embodiment. The pixel 101 of the present embodiment is different from that of the first embodiment in that each pixel circuit 110 is shared by and provided to two photodiodes 103a and 103b.

With such an arrangement of pixels, a signal of a single photodiode 103a can be read out by reading out a signal on the vertical output line 102 at time Ta. This signal can be used as a ranging signal. Further, a signal of the entire light receiving unit can be read out by reading out a signal on the vertical output line 102 at time (Ta+b). This signal can be used as an image signal.

Figure 10B:
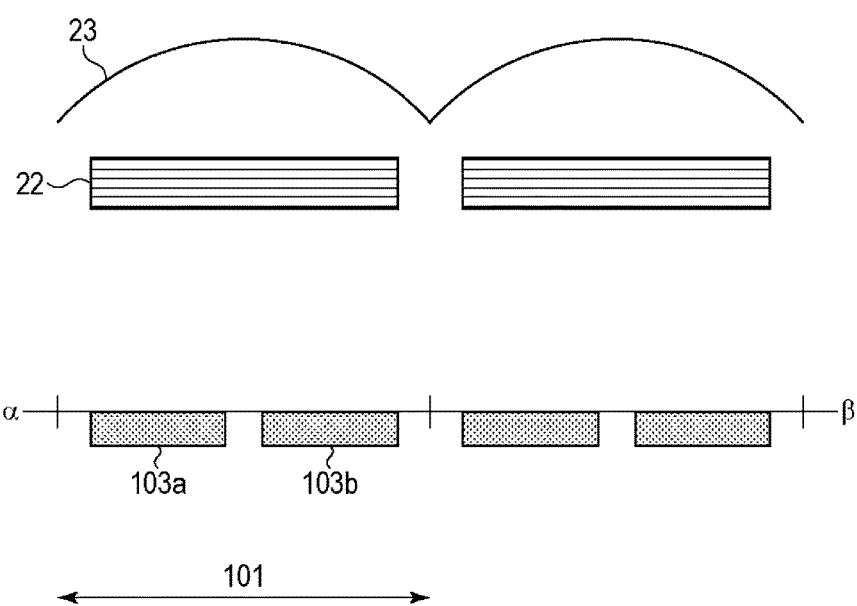
FIG. 10B is a sectional view of the pixels according to the third embodiment.

FIG. 10B is a sectional view of a portion taken along a line α-β in FIG. 10A. Since the sectional structure of the portion of the line α-β is the same as that of FIG. 3A, description thereof will be omitted.

In the third embodiment, ranging signals are added at the output terminals of the amplifier circuits 132 to output an addition signal, and saturation flags are output together. According to this configuration in the present embodiment, unlike the first and the second embodiments, addition of signals and determination of saturation are performed in a state of analog signals instead of in a state of digital signals. The system processing component outside the imaging device can determine whether or not a signal reaching a saturation level is included in an addition signal by referring to saturation flags. Therefore, the same advantages as those in the first embodiment can be obtained. In addition, since an addition signal that is obtained by addition at the readout circuits 13a and 13b is output in the present embodiment, the number of signals can be reduced and thus transmission time can be reduced. This allows for faster processing.

Fourth Embodiment

Figure 11:
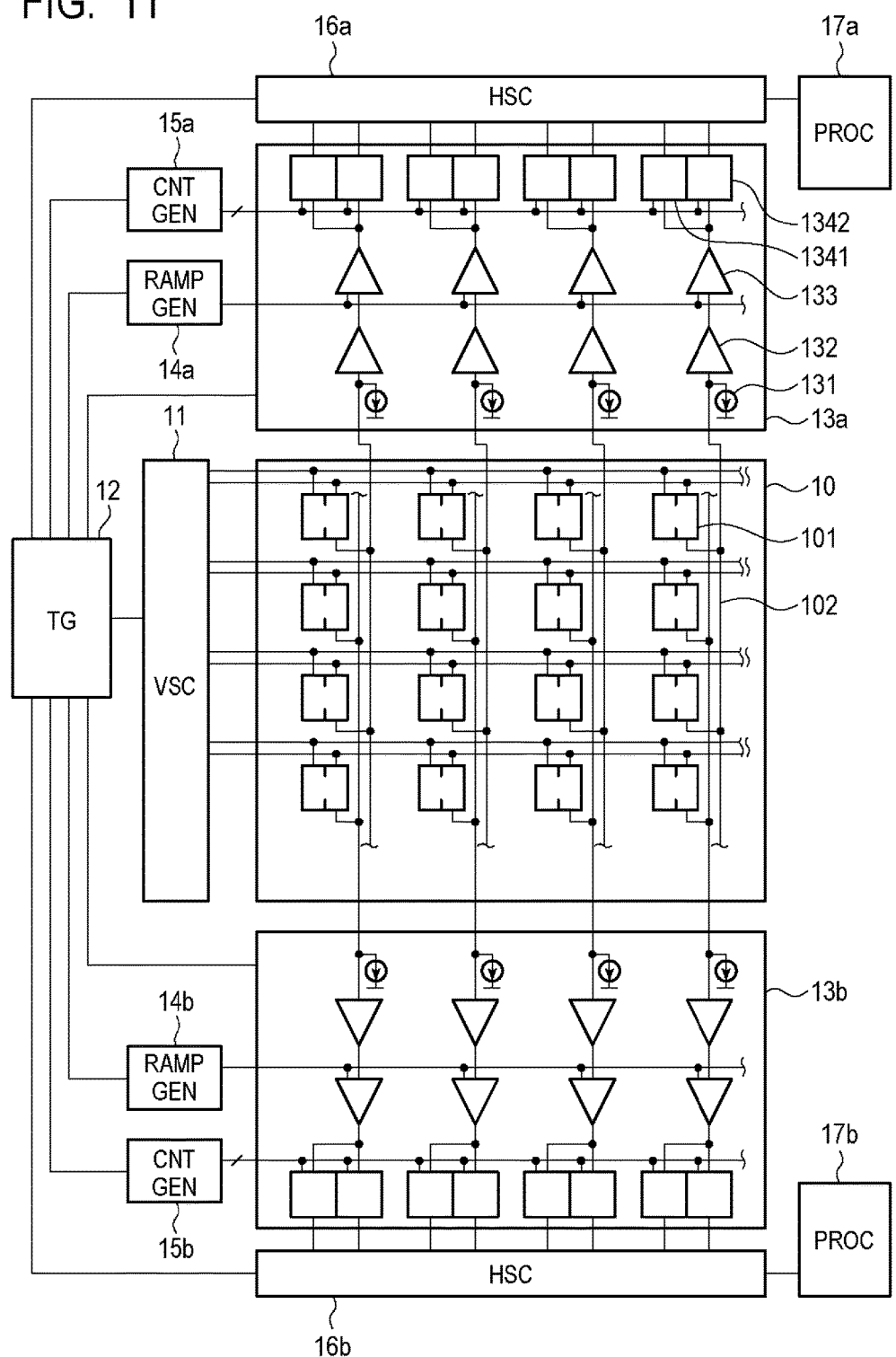
FIG. 11 is a diagram illustrating a configuration of an imaging device according to a fourth embodiment.

FIG. 11 is a diagram illustrating a configuration of an imaging device according to the fourth embodiment. The configuration of the pixel 101 in the present embodiment is the same as the configuration illustrated in FIG. 9A, FIG. 10A, and FIG. 10B described as the third embodiment. Further, configurations of other elements of the imaging device of the present embodiment are the same as those of the first embodiment except memories. In the present embodiment, ranging signal memories 1341 and image signal memories 1342 are provided instead of the memories 134 of the first embodiment.

Operation of the ranging signal memories 1341 and the image signal memories 1342 will be described. At a timing of time Ta of FIG. 9B, each signal from each photodiode 103a is AD-converted by each comparator 133 (hereafter, denoted as a-conversion). Each digital signal (a-signal) generated by this a-conversion is held in each of the ranging signal memories 1341.

Subsequently, at a timing of time (Ta+b) of FIG. 9B, a signal corresponding to a sum of signals from the photodiode 103a and the photodiode 103b is AD-converted by the comparator 133 (hereafter, denoted as a+b conversion). The digital signal (a+b signal) generated by this a+b conversion is held in each of the image signal memories 1342.

That is, in the present embodiment, due to the configuration that enables each pixel 101 to output a ranging signal and an image signal, each ranging signal memory 1341 and each image signal memory 1342 are provided such that a ranging signal and an image signal can be held in a separate manner.

Figure 12:
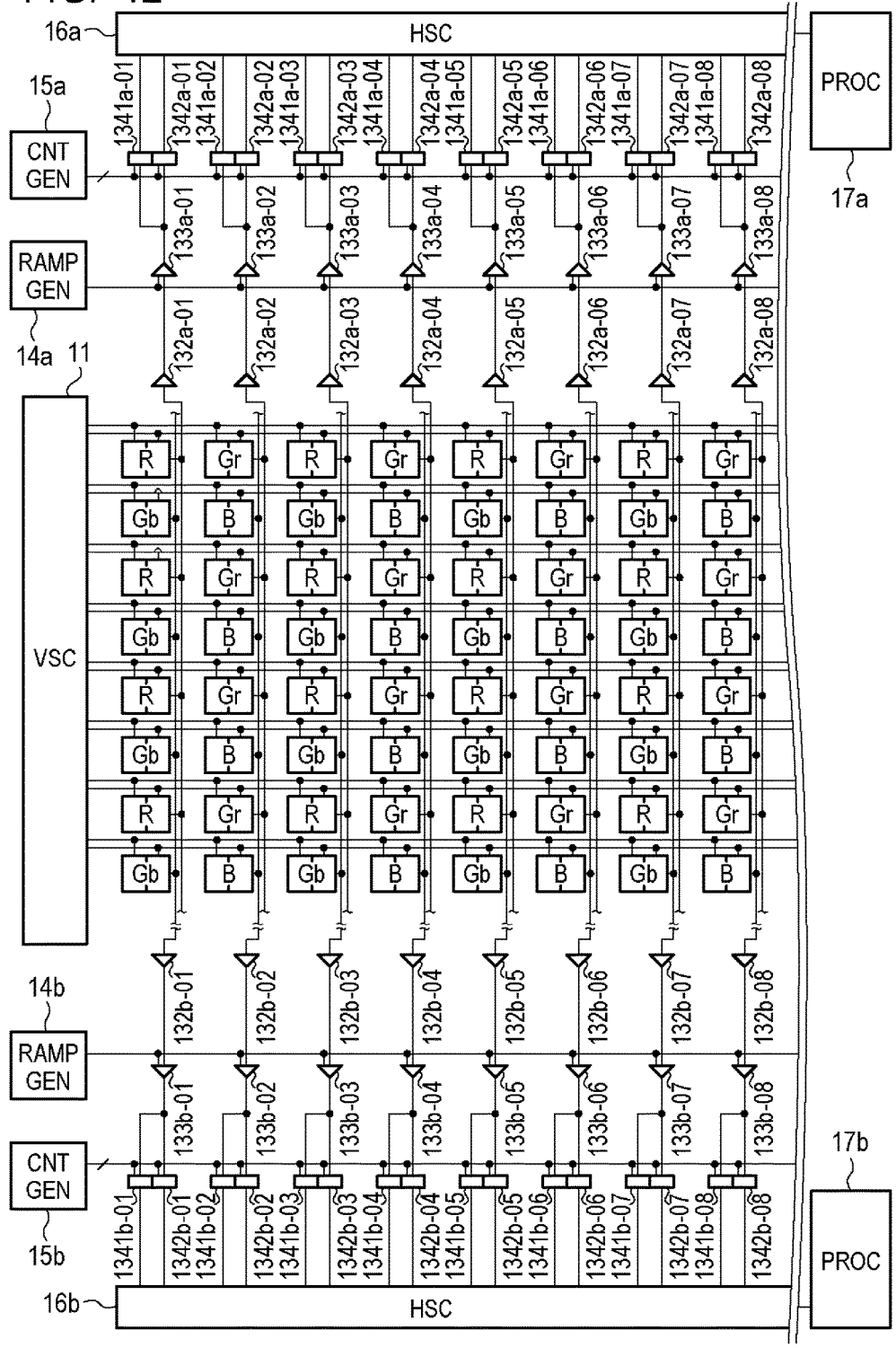
FIG. 12 is a diagram illustrating the configuration of the imaging device according to the fourth embodiment in greater detail.
Figure 13:
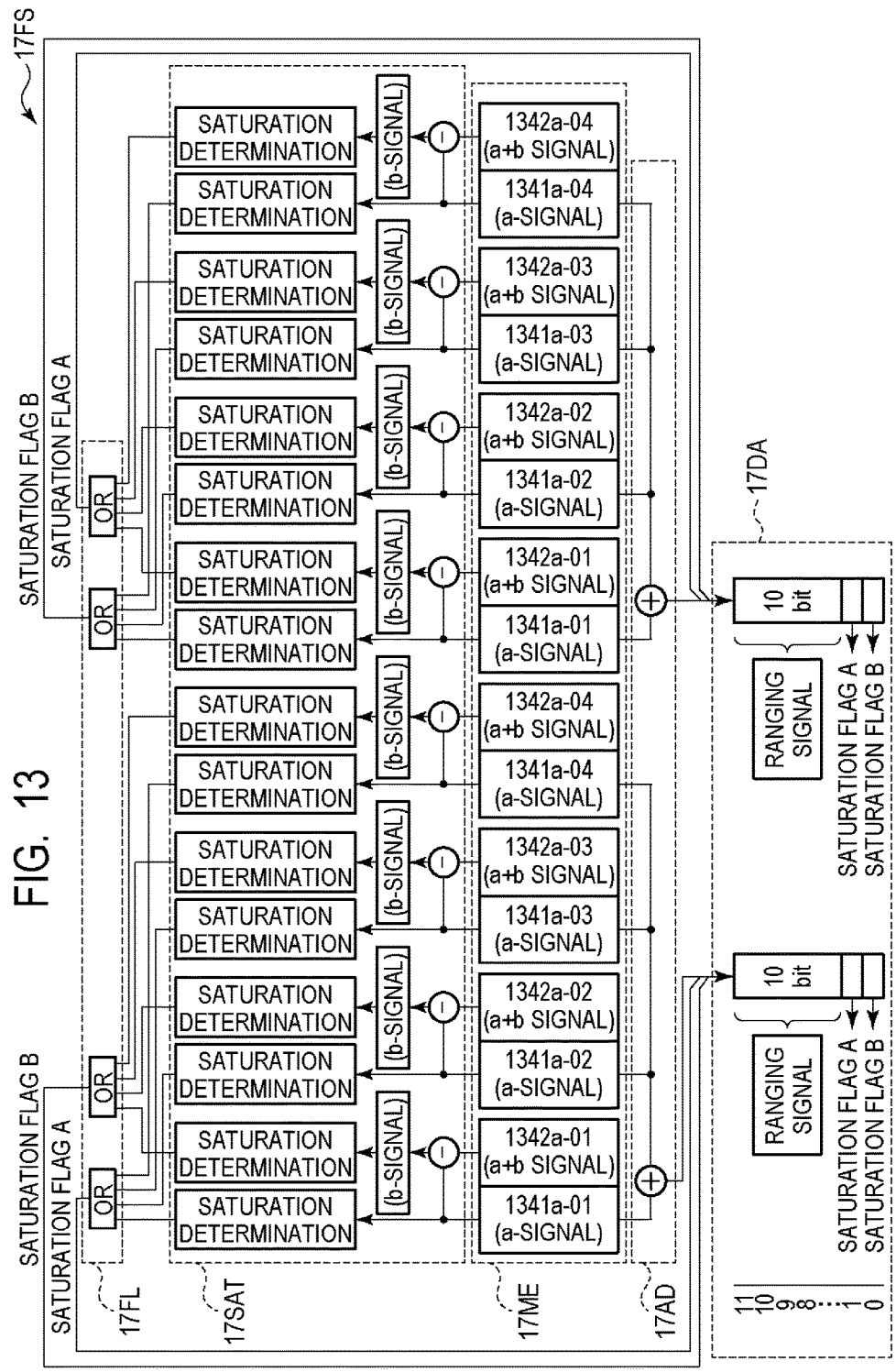
FIG. 13 is a diagram illustrating a signal output process according to the fourth embodiment.

Next, with reference to FIG. 12 and FIG. 13, processes of output signals in the present embodiment will be described mainly for sections different from the first to third embodiments. In the signal processing unit 17a, generation of an image signal and a ranging signal is processed based on input D data. A process of image signals will first be described.

First, D data corresponding to a sum of signals from the photodiodes 103a and 103b of an R pixel on the first row and the first column is obtained from data of an image signal memory 1342a-01. This D data is used as an image signal of the R pixel on the first row and the first column.

Next, D data corresponding to a sum of signals from the photodiodes 103a and 103b of a Gr pixel on the first row and the second column is obtained from data of an image signal memory 1342a-02. This D data is used as an image signal of the Gr pixel on the first row and the second column. In the same manner, image signals corresponding to respective pixels are obtained.

In parallel with the above process of image signals, a process of ranging signals is performed. FIG. 13 is a diagram illustrating a configuration of a ranging signal processing unit 17FS that is provided in the signal processing unit 17 to process ranging signals.

The saturation determination unit 17SAT determines whether or not each D data form each of the ranging signal memories 1341a-01, 1341a-02, 1341a-03, and 1341a-04 has reached a saturation level. The saturation determination unit 17SAT outputs a High signal to the saturation flag generating unit 17FL when determining that a saturation level has been reached, and outputs a Low signal to the saturation flag generating unit 17FL when determining that a saturation level has not been reached.

When it is determined that at least one of the four D data is larger than the saturation threshold based on a signal from the saturation determination unit 17SAT, the saturation flag generating unit 17FL sets a saturation flag A to High and outputs it to the signal output unit 17DA. That is, the saturation flag generating unit 17FL outputs a logical sum of signals from the saturation determination unit 17SAT as the saturation flag A.

The saturation determination unit 17SAT further generates a signal (b-signal) corresponding to a difference between D data from the image signal memory 1342a-01 and D data from the ranging signal memory 1341a-01. The saturation determination unit 17SAT determines whether or not the signal corresponding to the difference has reached a signal saturation level. Determination is made for a difference between D data from the image signal memory 1342a-02 and D data from the ranging signal memory 1341a-02 in the same manner. Furthermore, determination is made for a difference between D data from the image signal memory 1342a-03 and D data from the ranging signal memory 1341a-03 and for a difference between D data from the image signal memory 1342a-04 and D data from the ranging signal memory 1341a-04. In such a way, four differences are calculated.

When it is determined that at least one of the four differences is larger than the saturation threshold based on a signal from the saturation determination unit 17SAT, the saturation flag generating unit 17FL sets a saturation flag B to High and outputs it to the signal output unit 17DA.

In parallel with generation of the saturation flags A and B described above, the adder unit 17AD adds D data from the ranging signal memories 1341a-01, 1341a-02, 1341a-03, and 1341a-04 and outputs the addition to the signal output unit 17DA. This results in an output that adds signals of the four photodiodes 103a on the first row and the first column to the first row and the fourth column. This signal is used as a ranging signal.

The signal output unit 17DA outputs the saturation flag A and the saturation flag B together with a ranging signal that is an addition for four pixels. For example, when a ranging signal that is an addition for four pixels has 10 bits, an output signal will be a 12-bit signal in which the 10-bit ranging signal is attached with one-bit saturation flag A and one-bit saturation flag B, as illustrated in FIG. 13. In such a way, ranging signals are processed. The same process is performed in the signal processing unit 17b to output a signal in which saturation flags Gb and B are attached to a ranging signal that is an addition for four pixels on the second row and the first column to the second row and the fourth column.

In the present embodiment, the same advantages as those in the first embodiment can be obtained. Note that, although the saturation flag A and the saturation flag B are output separately, respectively in the above description, a logical sum of the saturation flag A and the saturation flag B may be calculated to output compressed one-bit data. Compressing saturation flags to reduce the number of bits can reduce transmission load of D data.

Fifth Embodiment

The present embodiment relates to an imaging system to which the imaging device described in any of the first to fourth embodiments is applied.

Figure 14:
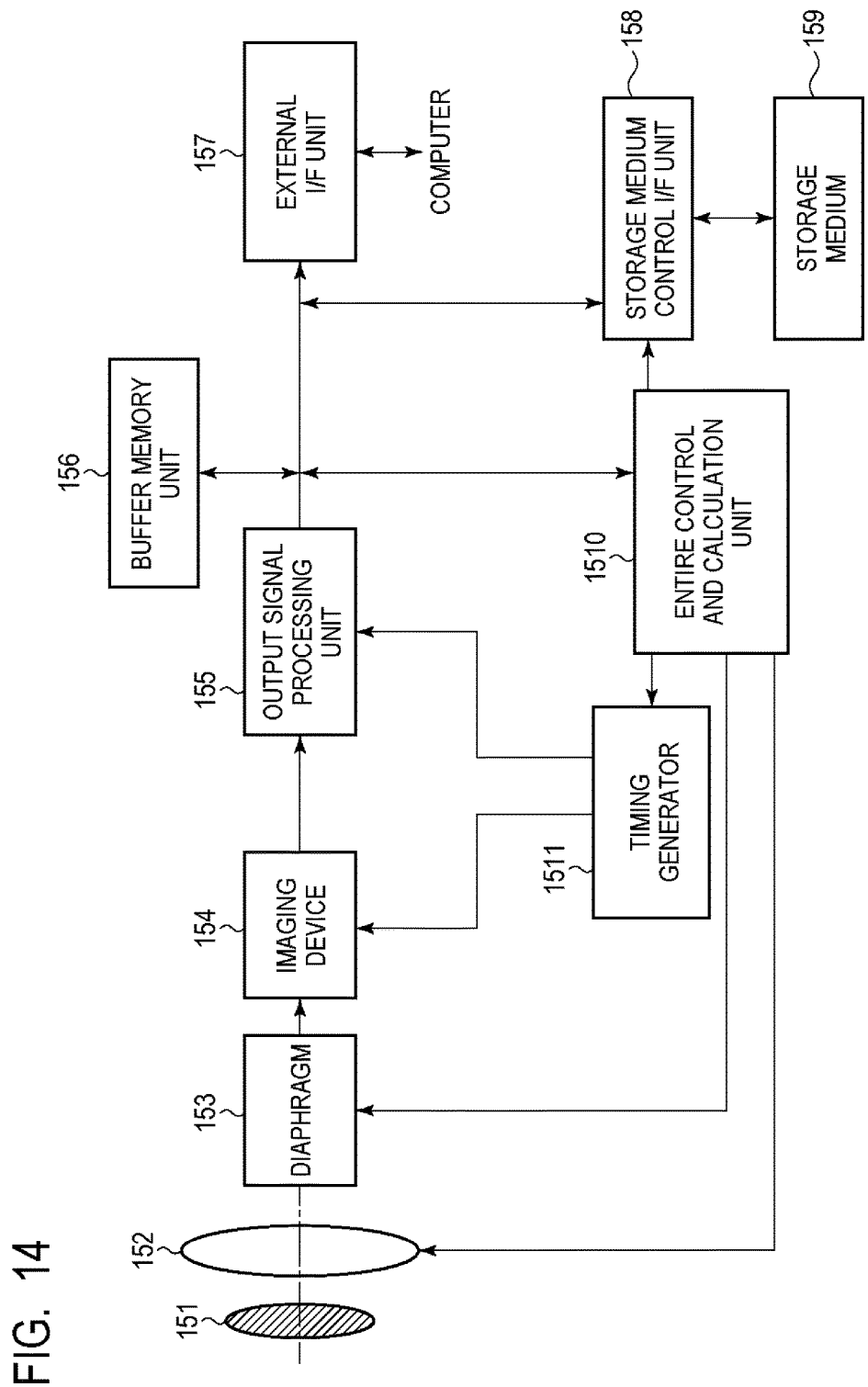
FIG. 14 is a diagram illustrating a configuration of an imaging system according to a fifth embodiment.

An example of an imaging system may be a digital still camera, a digital camcorder, a surveillance camera, and the like. FIG. 14 illustrates a schematic diagram for a case where an imaging device is applied to a digital still camera as an example of the imaging system.

An imaging system exemplified in FIG. 14 has a barrier 151 for protection of a lens, a lens 152 that captures an optical image of a subject on an imaging device 154, and a diaphragm 153 for changing the amount of a light passing through the lens 152. The lens 152 and the diaphragm 153 are optics for converging a light onto the imaging device 154. Further, the imaging system illustrated in FIG. 14 has an output signal processing unit 155 that processes output signals output by the imaging device 154. The output signal processing unit 155 operates to output signals through various correction and/or compression as necessity.

The imaging system exemplified in FIG. 14 further has a buffer memory unit 156 for temporarily storing image data, and an external interface unit 157 for communicating with an external computer or the like. Furthermore, the imaging system has a removable storage medium 159 such as a semiconductor memory for performing recording or readout of captured data, and a storage medium control interface unit 158 for performing recording or readout to the storage medium 159. Furthermore, the imaging system has an entire control and calculation unit 1510 that performs various calculations and controls the entire digital still camera, and a timing generator unit 1511 that outputs various timing signals to the imaging device 154 and the output signal processing unit 155. In this example, the timing signal or the like may be input externally, and the imaging system preferably has at least the imaging device 154 and the output signal processing unit 155 that processes output signals that are output from the imaging device 154.

The output signal processing unit 155 may be the system processing component described in the first to fourth embodiments. That is, the output signal processing unit 155 subtracts a digital A signal (a signal from the photodiode 103a) from a digital A+B signal (a signal corresponding to a sum of signals from the two photodiodes 103a and 103b) to generate a digital B signal (a signal from the photodiode 103b). The output signal processing unit 155 then uses the digital A signal and the digital B signal to perform focus detection by a phase difference detection system. Further, the output signal processing unit 155 uses the digital A+B signal to form an image. Note that some or all of the processes performed in the readout circuits 13a and 13b described in the first to fourth embodiments may be configured to be performed by the output signal processing unit 155.

As described above, the imaging system of the present embodiment can apply the imaging device 154 to perform a focus detection operation and a capturing operation.

The imaging devices described in the above first to fifth embodiments and the imaging system on which the same is mounted can reduce an error that would otherwise occur due to saturation of at least one of a plurality of signals to be added.

Other Embodiments

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-147685 filed Jul. 27, 2015, which is hereby incorporated by reference herein in its entirety.

What is claimed is:

1. An imaging device comprising:
a pixel unit including a plurality of pixels arranged in a matrix,
wherein each of the plurality of pixels includes m photoelectric conversion units configured to generate signal charges, where m is an integer greater than or equal to two, and outputs a signal based on the signal charges, and
wherein each of at least a part of the plurality of pixels outputs a first signal that is based on the signal charges of n photoelectric conversion unit or units out of the m photoelectric conversion units, where n is an integer less than m;
an adder unit configured to add a plurality of the first signals output from the plurality of pixels which are different from each other;
a determination unit configured to determine whether or not the plurality of the first signals added by the adder unit include a signal greater than a predetermined threshold; and
an output unit configured to output a determination result determined by the determination unit and a signal obtained by the adder unit adding the plurality of the first signals,
wherein the imaging device further comprises:
a plurality of analog-to-digital conversion circuits each of which converts an analog signal into a digital signal and outputs the digital signal,
wherein each of the at least a part of the plurality of pixels,
outputs, as an analog signal, the first signal that is based on the signal charges of the n photoelectric conversion unit or units, and
outputs, as an analog signal, a second signal that is based on the signal charges of the m photoelectric conversion units,
wherein each of the plurality of analog-to-digital conversion circuits,
converts the first signal into a digital signal that is based on the first signal, and
converts the second signal into a digital signal that is based on the second signal,
wherein the adder unit adds a digital signal that is based on the first signal of a first pixel and a digital signal that is based on the first signal of a second pixel of the plurality of pixels, the second pixel being different from the first pixel, and
wherein the determination unit,
subtracts a digital signal that is based on the first pixel of the plurality of pixels from a digital signal that is based on the second signal of the first pixel to generate a third signal that is based on the signal charges of m minus n of the photoelectric conversion unit or units resulted by excluding the n photoelectric conversion unit or units from the m photoelectric conversion units, and further determines whether or not a plurality of the third signals corresponding to a plurality of pixels which output a plurality of the first signals subjected to the addition include a signal larger than a predetermined threshold.

2. The imaging device according to claim 1, wherein the output unit outputs a determination result compressed by calculating a logical sum of a determination result as to whether or not the plurality of the first signals include a signal larger than a predetermined threshold and a determination result as to whether or not the plurality of the third signals include a signal larger than a predetermined threshold.

3. The imaging device according to claim 1, wherein the first pixel and the second pixel are adjacent to each other.

4. The imaging device according to claim 1, wherein the number of signals that are output from the output unit and based on the first signals is less than the number of signals that are output from the output unit and based on second signals that are based on the signal charges of the m photoelectric conversion units.

5. The imaging device according to claim 1, wherein the predetermined threshold is set to a value corresponding to a saturation level of a signal.

* * * * *